(12) United States Patent
Harris

(10) Patent No.: US 7,158,591 B2
(45) Date of Patent: Jan. 2, 2007

(54) RECURSIVE RESAMPLING DIGITAL FILTER STRUCTURE FOR DEMODULATING 3G WIRELESS SIGNALS

(75) Inventor: Fredric Joel Harris, Lemon Grove, CA (US)

(73) Assignee: Signum Concept, Inc., Lemon Grove, CA (US)

( * ) Notice: Subject to any disclaimer, the term of this patent is extended or adjusted under 35 U.S.C. 154(b) by 809 days.

(21) Appl. No.: 09/905,717

(22) Filed: May 9, 2001

(65) Prior Publication Data

US 2003/0076907 A1    Apr. 24, 2003

(51) Int. Cl.
H04B 1/10        (2006.01)
H03H 7/30        (2006.01)
H04J 1/00        (2006.01)

(52) U.S. Cl. ............... 375/350; 375/229; 370/342

(58) Field of Classification Search ........... 375/220, 375/240, 316, 350, 229, 260; 370/396, 466, 370/437, 464, 468, 342; 455/168.1, 434, 455/454, 450–564, 507, 67.1, 423; 708/313; 341/61

See application file for complete search history.

(56) References Cited

U.S. PATENT DOCUMENTS

| | | | | |
|---|---|---|---|---|
| 4,864,526 A | * | 9/1989 | Dyer | 708/313 |
| 5,309,484 A | * | 5/1994 | McLane et al. | 375/354 |
| 5,325,318 A | * | 6/1994 | Harris et al. | 708/313 |
| 5,504,785 A | * | 4/1996 | Becker et al. | 375/344 |
| 5,566,173 A | * | 10/1996 | Steinbrecher | 370/466 |
| 5,657,261 A | * | 8/1997 | Wilson et al. | 708/313 |
| 5,757,867 A | * | 5/1998 | Caulfield et al. | 375/350 |
| 5,926,455 A | * | 7/1999 | Allpress | 370/210 |
| 6,134,268 A | * | 10/2000 | McCoy | 375/229 |
| 6,141,372 A | * | 10/2000 | Chalmers | 375/147 |
| 6,411,653 B1 | * | 6/2002 | Arunachalam et al. | 375/260 |
| 6,480,535 B1 | * | 11/2002 | Witmayer | 375/232 |
| 6,496,546 B1 | * | 12/2002 | Allpress et al. | 375/316 |
| 6,531,969 B1 | * | 3/2003 | Chu | 341/61 |
| 6,798,850 B1 | * | 9/2004 | Wedin et al. | 375/340 |
| 2003/0076899 A1 | * | 4/2003 | Kumar et al. | 375/316 |

* cited by examiner

Primary Examiner—Emmanuel Bayard
Assistant Examiner—Lawrence B. Williams
(74) Attorney, Agent, or Firm—Robert A. Brown

(57) ABSTRACT

A filter and processing sequence is described that efficiently combines and performs two or more tasks required to demodulate a composite 3G (third generation) wireless signal formed by a combination of wideband 3.84 MHz (Universal Mobile Telecommunications System, identiied a acronym "UMTS", or Universal Mobile Telecommunications System Terrestrial Radio Access, identified as acronym "UTRA") carriers and narrowband 1.2288 MHz CDMA-2000 carriers. The three tasks, applied to each spectral component of the 3G wireless signal and described in the order of a traditional filtering structure are: Spectral translation, Bandwidth Reduction, and Sample Rate Selection. These tasks are traditionally implemented in three distinct pieces of hardware or software modules.

1 Claim, 15 Drawing Sheets

One for each Channel

One for each Channel

One for each Channel

RECURSIVE RESAMPLING DIGITAL FILTER STRUCTURE FOR DEMODULATING 3G WIRELESS SIGNALS

BACKGROUND OF THE INVENTION

A filter and processing sequence is described that efficiently combines and performs two or more tasks required to demodulate a composite 3G (third generation) wireless signal formed by a combination of wideband 3.84 MHz (Universal Mobile Telecommunications System, hereinafter referred to as "UMTS" or Universal Mobile Telecommunications System Terrestrial Radio Access, hereinafter referred to as "UTRA") carriers and narrowband 1.2288 MHz CDMA-2000 carriers. The three tasks, applied to each spectral component of the 3G wireless signal and described in the order of a traditional filtering structure are: Spectral translation, Bandwidth Reduction, and Sample Rate Selection. These tasks are traditionally implemented in three distinct pieces of hardware or software modules.

The spectrum processed by the receiver is shown in FIG. 1 while a block diagram of a traditional digital receiver that processes a signal with this spectrum is shown in FIG. 2. Note that the center frequencies of the wide-band signals are at multiples of 5.0 MHz while the center frequencies of the narrowband signals are at multiples of 1.25 MHz. The sample frequencies, shown in parenthesis and indicated on the block diagram, are typical and can be changed within wide limits and are presented here for purpose of discussing a specific example. Particular implementation efficiency is to be had when the sample rate is selected to be a rational multiple of the spectral spacing between band centers. This condition makes the spectral down conversion particularly simple. Similarly, implementation efficiency is also to be had when the sample rate is selected to be a rational multiple of the desired output sample rate. This condition makes the alignment of time samples with signal epochs particularly simple. Neither condition is a requirement for the process described here, since an arbitrary rate interpolator can be used to align the sampling clock with either timing or carrier sub systems.

When describing the processing technique presented herein we will use sample rates selected to satisfy the timing consideration. The sample rate indicated in FIG. 1 has been selected to demonstrate the high computational efficiency available for timing recovery from the process described herein.

The tasks and the associated modules that implement the functions in a traditional receiver are: (1) Spectral Translation, (2) Bandwidth Reduction, and (3) Output Sample Rate Selection. The Spectral Translation is performed by a complex heterodyne that translates the center of the desired spectral band to base-band. The complex heterodyne multiplies the input data sequence by samples of a cosine wave and a sine wave with frequency selected to match the center of the desired band. The Bandwidth Reduction is performed by a digital filter that processes the complex input data stream of the down-converted signal. The digital filter performs the required weighted sums to form the reduced bandwidth output data stream. The digital filter performs a low-pass filtering process that restricts the signal bandwidth to that of the translated band, and consequently rejects the remaining spectral components of the translated signal. The Output Sample Rate Selection is performed by a complex digital filter known as an interpolator that accept input data from the previously described low-pass filter at a fixed input rate that satisfies the Nyquist Criterion, and computes from these samples a set of output samples at an output rate different from the input rate and selected to satisfy some signal conditioning constraint in subsequent processing following this processing block.

SUMMARY OF THE INVENTION

The invention described here combines two or more of the processing tasks described above in a single filter, and further has the single filter perform the tasks for more than one center frequency signal. The filter structure is the well-known polyphase partition. In this structure a single filter is partitioned into M-parallel paths each representing a section of the prototype filter. The outputs of these paths are combined with fixed phase rotators to obtain separate time series from the multiple center frequency bands of interest. In this parallel path structure, different center frequencies only affect the set of scalar phase rotators associated with each path. Thus the combination of polyphase partition with their post filter phase rotators permits the single filter to operate at each of the filter bank center frequencies simultaneously.

Figure 3A:
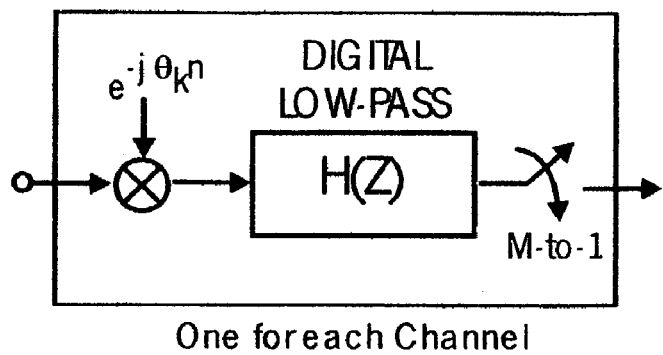
FIG. 3a depicts Traditional Order of Channel Selection and Processing.

FIGS. 3 presents block diagrams of the sequence of transformations that preserve the desired signal-processing task while establishing the condition that enable a single polyphase partition of the filter to provide outputs signals, simultaneously, from different center frequencies. In the traditional receiver structure, shown in FIG. 3*a*, the complex heterodyne down converts or translates the spectrum of the input signal from its center frequency to the center frequency of the low-pass filter. Without loss of generality, we will assume the low pass filter is centered at DC or zero frequency.

Figure 3B:
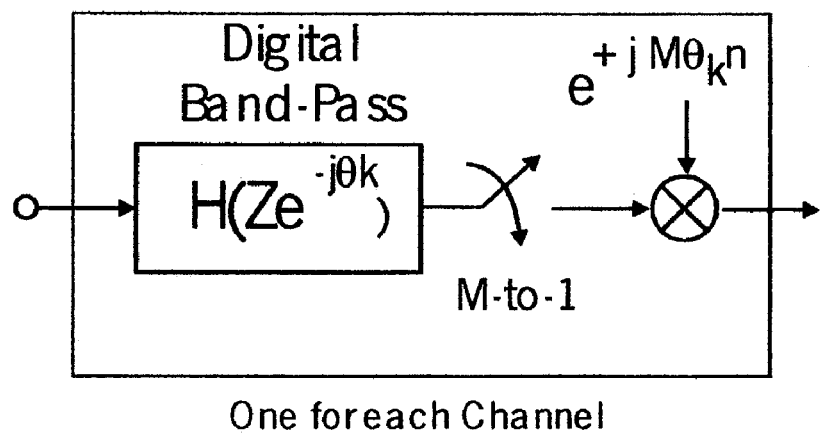
FIG. 3b shows Reordered Channel Selection and Processing Stream.

In an equivalent, but alternate structure, a complex band pass filter replaces the low pass filter. This filter has an impulse response formed as the product of the low pass impulse response h(n) and the up-converting complex heterodyne sequence $\exp(j\omega_o T_s n)$ of the same length. Here the heterodyne is applied to the filter to move its center frequency to the band center of the signal rather than the standard approach, which applies the heterodyne to the signal to move its band to the filter's spectral location. In this structure, the filtering occurs at the signal's center frequency, and the output of the filter is properly band limited but still resides at the carrier center frequency. If it is desired to translate the signal spectra to base band, this down conversion can be applied after the filter as shown in FIG. 3*b*.

Since the signal bandwidth has been reduced by the band limiting action of the digital filter, it is common to reduce the sample rate of the down converted and filtered time series. The heterodyne following the band pass filter can be moved to the low data rate side of the down sampler. Now only the samples delivered to the output of the down sampler are subjected to the heterodyne and the workload of the heterodyne is reduced by the same M-to-1 ratio of the input to output sampling rates. The down sampling operation is thus applied to the band-centered signal. Reducing the sample rate of the carrier centered signal results in an alias induced spectral translation of the center frequency from $f_c$ with angular rotation rate of $2\pi f_c/f_s$ per sample to an angular rotation rate of $2\pi M f_c/f_s$ modulo($2\pi$). If the center frequency $f_c$ is any multiple of the output sample rate, say k $f_s/M$, then the aliased rotation rate is $2\pi M (k f_s/M)/f_s$ modulo($2\pi$) or k $2\pi$ modulo($2\pi$) which is congruent to zero, which means the output rate of rotation is zero radians per sample. For the proper choice of center frequency relative to sample rate, the down sampled data samples represent a signal that has been aliased to DC. Selection of the sample rate to be an integer multiple of the signal center frequency is one of the suggested restrictions addressed earlier. The restriction is also applicable when the ratio of sample rate to center frequency is a rational ratio of small integers.

Figure 3C:
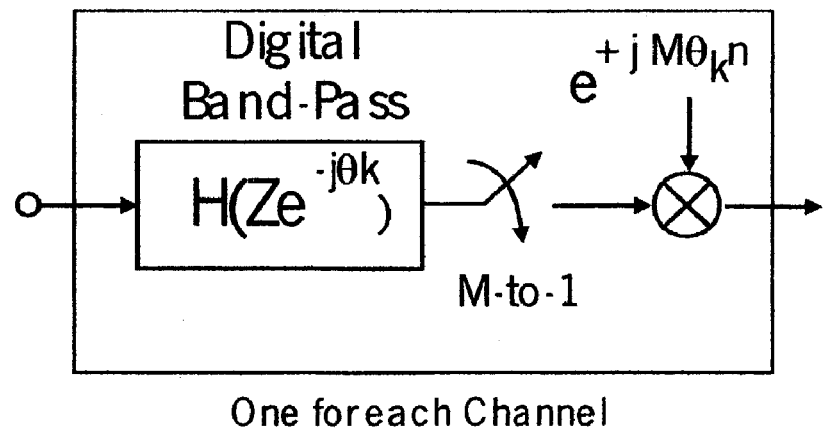
FIG. 3c depicts Reordering Re-Sampling and Down-Conversion.

Any multiple of the output sample rate will alias to DC or zero frequency. Similarly, any offset from a multiple of the output sample rate will alias to the same offset from DC or zero frequency. A heterodyne following the down sampling can then remove this residual offset. Thus the spectral translation from the channel center can be accomplished at the filter output prior to the down sampling or after the down sampling by a combination of aliasing and reduced data rate heterodyne. The sliding of the output heterodyne to the downside of the output resampler is shown in FIG. 3*c*. Applying the heterodyne after the down sampling as opposed to prior to the down sampling results in a reduction of computational workload for the heterodyne operation.

Figure 4:
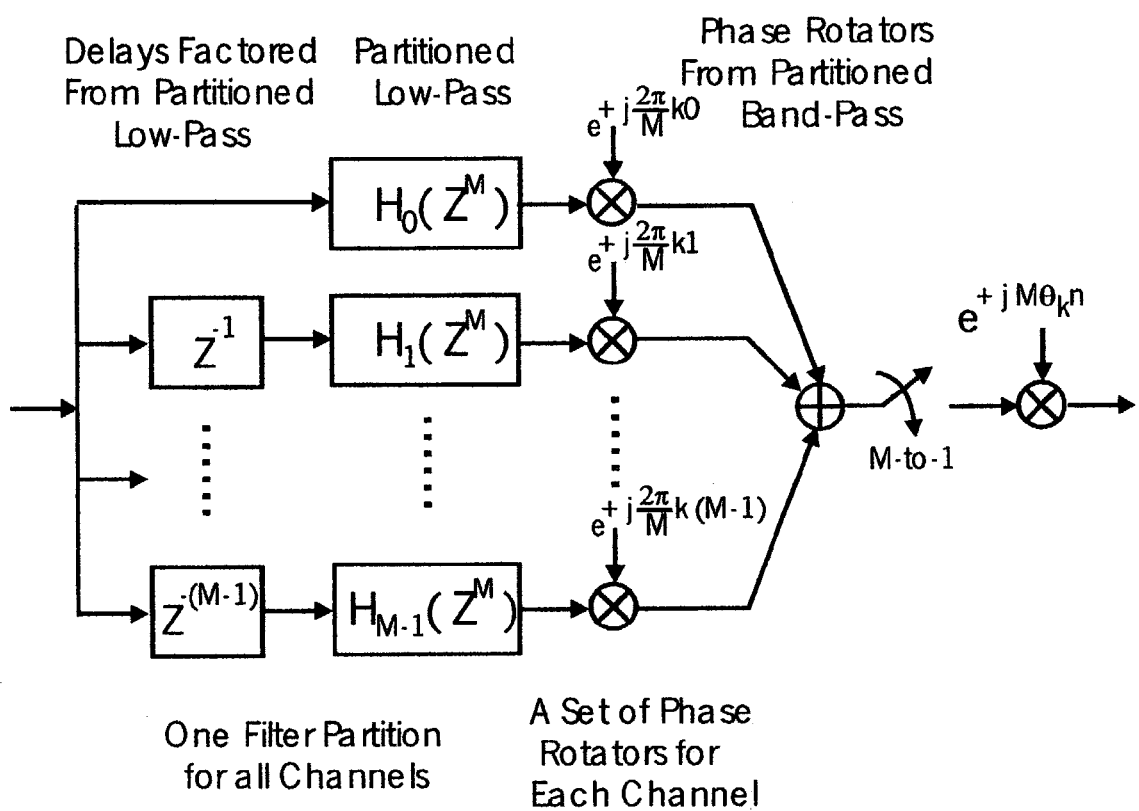
FIG. 4 shows A polyphase Partition of the Band Pass Filter Illustrating the Factoring to-the-Right of Phase Rotators from the Initial Up-Conversion Heterodyne of the Filter Weights.

FIG. 4 presents the polyphase partition of the band pass filter, with the filter operating at the input rate. In this M-fold partition the number of paths is defined by the number of center frequencies that alias to zero frequency when the output time series of the filter is down sampled from fs to fs/M. When the filtering operation includes the option to down sample prior to the filter we are permitted to change the input to output ratio by any rational ratio, 1/M representing only one of the options.

Figure 5:
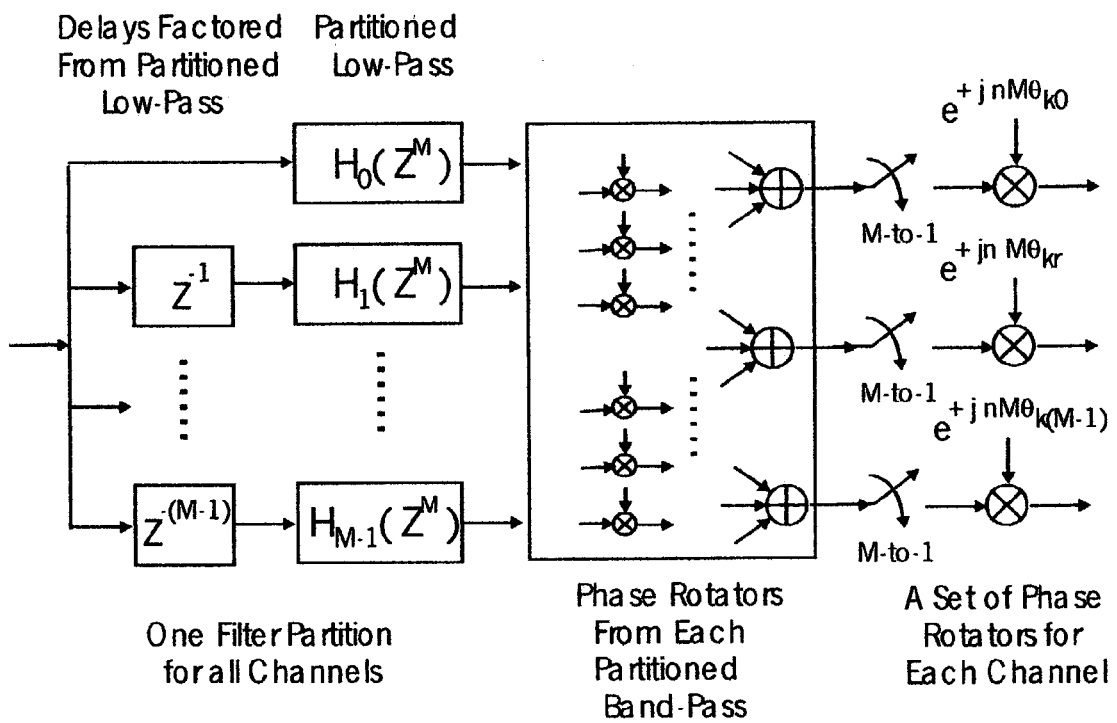
FIG. 5 shows Polyphase partition of a Single Prototype Low-Pass Filter, With Post Filtering Phase Rotators Performing the Band Centering Complex Heterodyne for Each Desired Output Center Frequency.

FIG. 4 presents the partition of the prototype filter operating in the partitioned mode at the input rate with the output heterodyne applied after the down sampling operation. Here the scalars that contributed to the up-conversion heterodyne of the prototype low-pass filter have been factored forward and have been applied as scalar phase rotators after each sub filter. Different phase rotators with the same single filter partition are associated with different center frequencies, thus multiple center frequencies can be simultaneously accommodated with concurrent sets of phase rotators. Thus the partitioned filter can be considered a single-input, multiple output process with the separate outputs formed by phase-shifted sums of the sub filter outputs. This structure is shown in FIG. 5.

Figure 6:
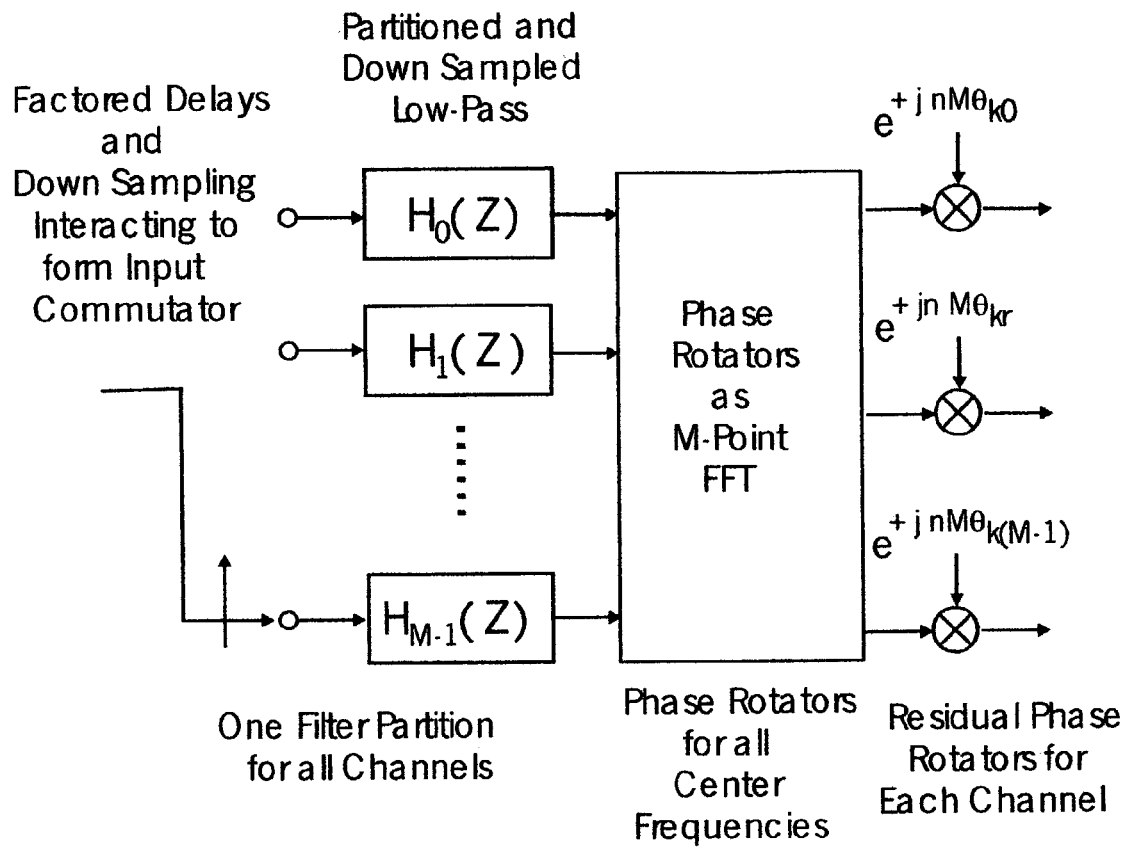
FIG. 6 depicts Re-Sampled Polyphase Partition of the Band Pass Filter With Input Commutator, Down Sampled Stages, FFT Based Post Filter Phase Rotators For Channels Selection, and Residual Frequency Shift of Aliased Center Frequencies.

When a large number of phase rotators are required to service multiple channels, they are implemented as a fast Fourier transform (FFT). We still have the option to perform the output heterodyne prior to down sampling, or after, and we still have the option to perform the down sampling, with an input commutator, prior to the filter segments rather than after. System considerations related to the interpolation requirements following the filtering and down conversion influence where the down sampling operation is to be performed. Computational efficiency is increased as the down sampler is moved towards the input data stream. Moving the down sampler to the input of the process results in the structure shown in FIG. 6. The primary advantage of this structure is that all of the processing, the partitioned filter, the phase rotators, and the residual heterodyne are accomplished at the output rate with none of the processing proceeding at the input rate. This is the most efficient multi-channel partition process.

Figure 2:
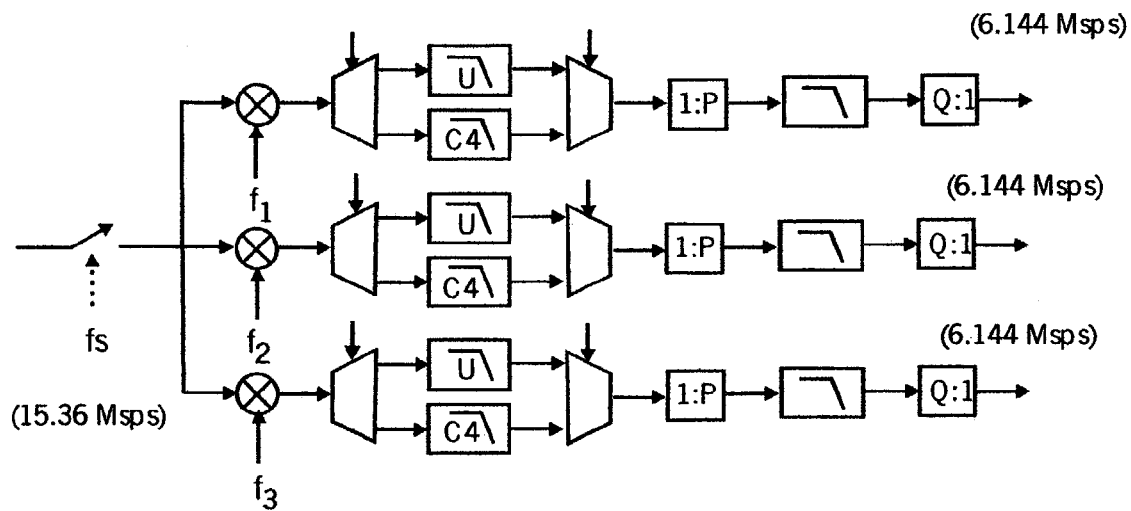
FIG. 2 shows Conventional Channelizer to Partition 3G Signal Set With Various Combinations of UTRA bands and CDMA-2000 Bands.

One final consideration in this class of polyphase filter partitions is that the down sampling that occurs via the input commutator can be modified to permit M-to-P sample rate change as opposed to the traditional M-to-1 change. This is accomplished by replacing the weight vector for each polyphase stage with a set of weight vectors that are cyclically accessed with period P while the stages are accessed with period M. This permits the sample rate change, normally allocated to a second interpolation filter, to also be imbedded in the polyphase filter. Thus the polyphase filter can, with proper attention to resampling, partitioning, and weight-set scheduling, accommodate the translation, filtering, and sample rate change of the entire filter bank process described in FIG. 2.

Figure 1:
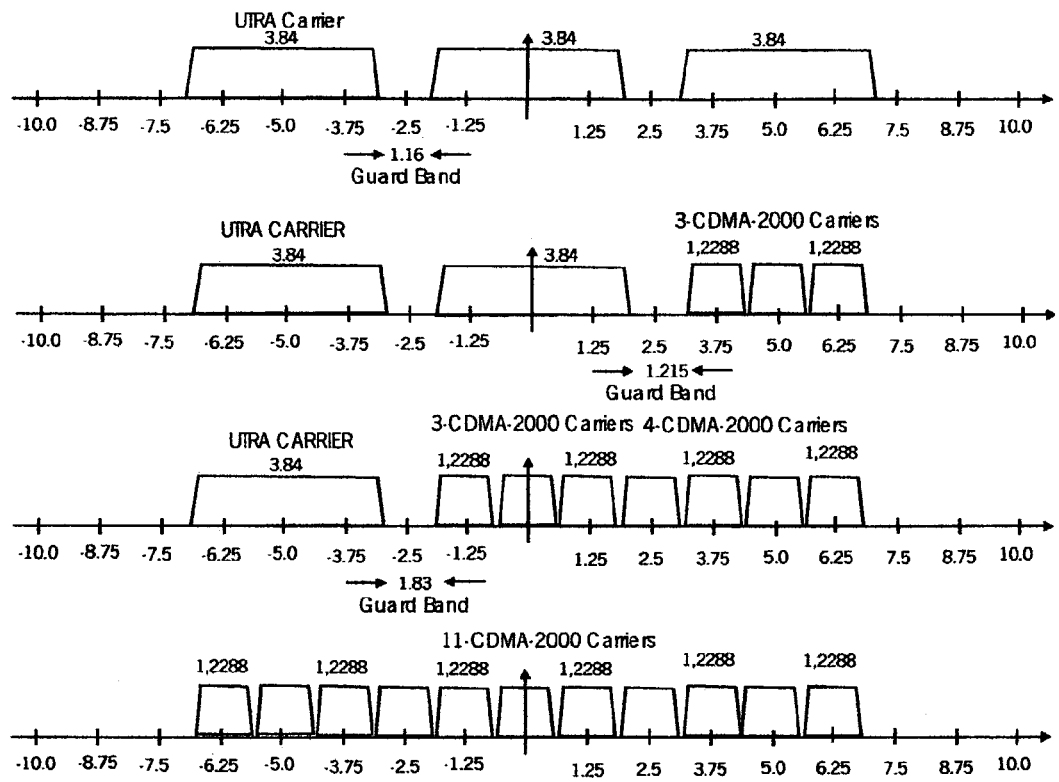
FIG. 1 depicts a Suite of Possible 3G Signal Spectra Formed by Various Combinations of UTRA bands and CDMA-2000 Bands.

Returning to FIG. 1, we note that the signal spectra to be processed by the receiver can have various mixes of narrow band and wide band components. This mix extends from zero, one, two, or three wide band components with eleven, eight, three, and zero narrowband components respectively. At one end we have three wide band signals and at the other end we have eleven narrow band signals. The assets required for these two extremes are different and can be optimized individually for each signal set. The remaining two signal configurations are mixed and require assets for both low and high bandwidth processing.

Figure 7:
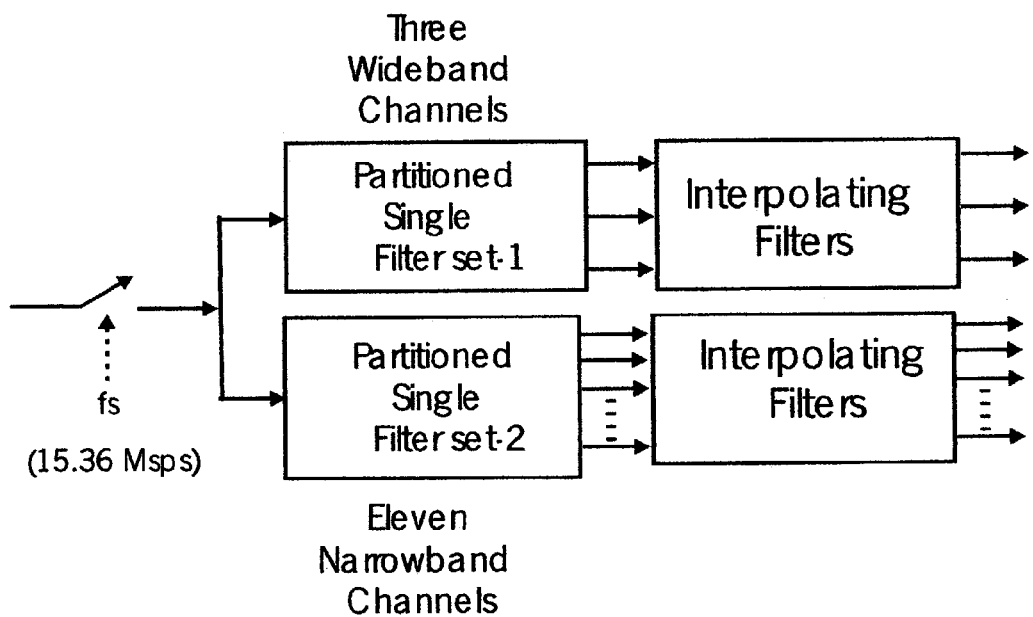
FIG. 7 shows Parallel Spectral Partition.
Figure 8:
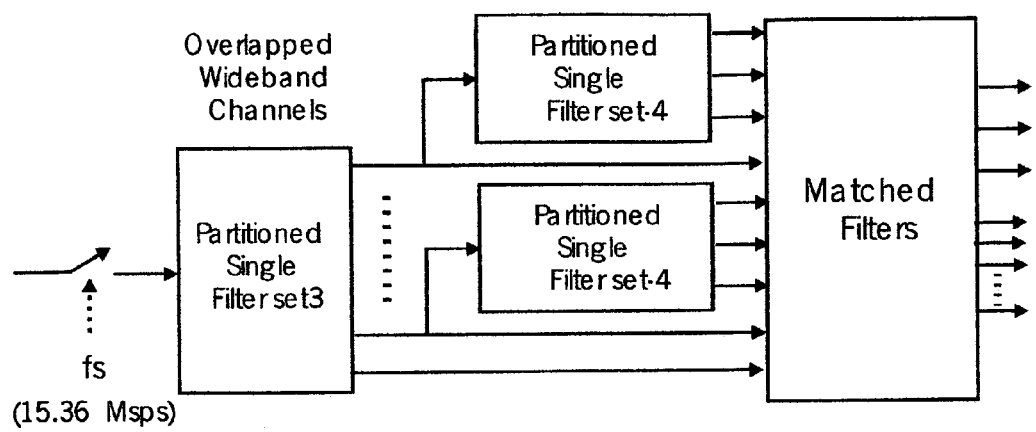
FIG. 8 shows Cascade Spectral Partition.

Because of the two classes of signals to be processed, the polyphase filter structure can be implemented as a cascade of processing tasks in two modes. In the first mode, the filter is implemented as two independent parallel structures with one performing the processing required to implement or service the needs of all three wideband signals and one performing the processing required to implement or service the needs of the eleven narrowband signals. In the second mode, the filters operate in cascade with one filter partitioning the full input bandwidth into overlapping spectral bands matched to the spectral width of the three wideband components and one filter processing the reduced bandwidth signals obtained from the first filter to obtain, if required, additional bandwidth reduction matched to the narrowband signals. These configurations are shown in FIGS. 7 and 8. In both cases, processing assets not required to process the particular input signal configuration are disengaged and powered down.

Following the philosophy that a filter should operate at the lowest possible sample rate consistent with its Nyquist rate, we will emphasize the second option composed of cascade processing tasks interspersed with appropriate resamplers between bandwidth reducing stages.

DESCRIPTION OF INVENTION

A set of digital filters composed of polyphase partitions of prototype low pass filters coupled with a process for performing sample rate changes within the filtering process is applied to the task of performing the simultaneous functions of channelizing, of filtering, and of resampling a frequency division multiplexed communication signal. In particular, the signal is a third generation (3G) signal suite composed of mixes of wideband UTRA (3.84 MHz) and narrowband (1.2244 MHz) spectral components with bandwidths and center frequencies shown in FIG. 1.

The collection of Multirate signal processing partitions and scheduling presented here take advantage of signal bandwidths and signal center frequency locations and separations to enable a single processing function to simultaneously perform bandwidth control, spectral translation, and resampling for separate channels with similar and related spectral characteristics. The process afford great reduction in processing load required to demodulate the multiple channels comprising the 3-G signal set.

The channelization system is first described at a high level by a collection of interconnected functional processing blocks assigned to perform specific processing tasks. The signal processing performed by a particular block may represent the entire processing required to extract a desired signal component from the composite signal, or it may represent one of a sequence of signal processing functions required to extract the desired signal. In general, the processing is performed in a hierarchical cascade of high level processing blocks. These blocks can be described by interconnections of lower level processing blocks that are common to many of the high level blocks. The filtering blocks are traditionally non-recursive because of the general ease with which the prototype low pass filter can be decomposed into polyphase segments. A particular class of recursive filters that permit the polyphase partition of its prototype low pass realization can also be used to form the processing blocks.

The recursive structures often exhibit spectral responses that occasionally require post processing spectral clean-up filters. These clean-up filters are unique to the recursive implementations, and represent additional processing blocks not present in the non-recursive implementation. The incentive to use a recursive implementation for the filtering blocks is the significant reduction in processing required for a given filtering task. The recursive polyphase filter can be implemented with structures that offer linear phase response, a property required to preserve signal fidelity. The recursive polyphase filter can also be implemented with non-uniform phase, with a marked reduction in processing workload. This option is viable when the receiver includes a channel equalizer that will attribute the filter phase distortion to the channel and correct it while inverting the channel response. The non-linear phase recursive polyphase structure offers additional flexibility in parameter selection for the cascade processing tasks. Implementations that mix and match from the three realization options can also offer design flexibility. This patent only describes the non-recursive implementation. Related and connected patents describe the recursive only, and the mixed non-recursive and recursive implementations.

Figure 9:
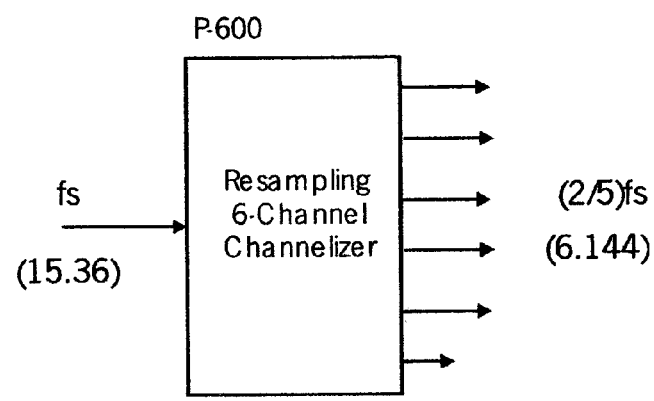
FIG. 9 shows Input-Output Signal Rates for Wideband Channelizer.
Figure 10:
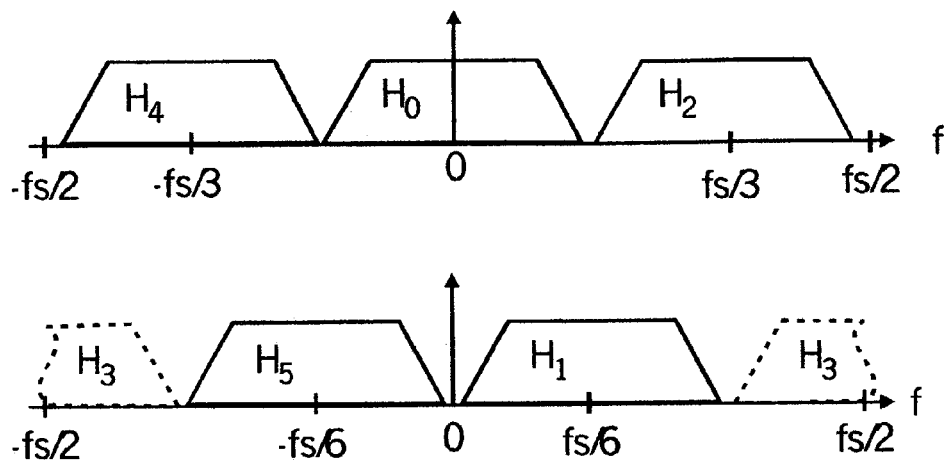
FIG. 10 depicts Frequency Centers and Span for Six-Channel Channelizer.

First Processing Block:

The first processing block of this invention is shown in FIG. 9 This block processes the signal composed of three wideband components, each 3.84 MHz wide, and separated by 5-MHz spectral centers. This spectrum is the first one shown in FIG. 1. The input sample rate is 15.36 MHz, a frequency selected so that the desired output sample rate of 6.144 MHz is easily available by a sample rate change of 2-to-5 (up 2 and down 5). The Spectral responses of the six-channel channelizer are shown in FIG. 10. Three of the bands, centered at −fs/3, 0, and fs/3 (−5.12 MHz, 0 MHz, and +5.12 MHz) are almost matched to the center frequency of the three-wideband UTRA carriers. The bandwidth spanned by the equivalent filters in the channelizer exceeds the UTRA bandwidth by a margin that allows for the offset of center frequencies. The remaining three bands overlap the first three and are centered at −fs/6, fs/2, and −fs/3 (−2.56 MHz, 7.68 MHz and −2.56 MHz). The band centered at the half sample rate is discarded so that five bands are extracted from the channelizer. The remaining pair of this second frequency set are reserved for sub-band partitioning of the CDMA-2000 carriers that are placed at ±2.56 MHz slots in two of the frequency assignment plans (see FIG. 1, third and fourth options).

Figure 11:
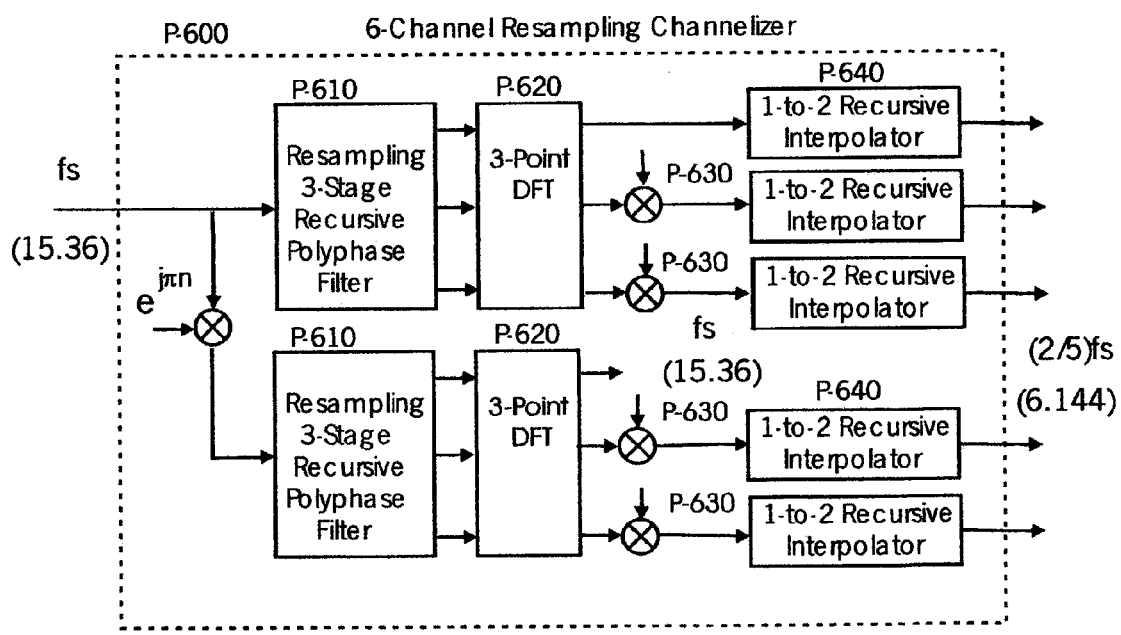
FIG. 11 shows Fundamental Processing blocks of a resampling six-channel Channelizer.

Three fundamental processing blocks shown in FIG. 11 forms the six-channel Channelizer.

Figure 12:
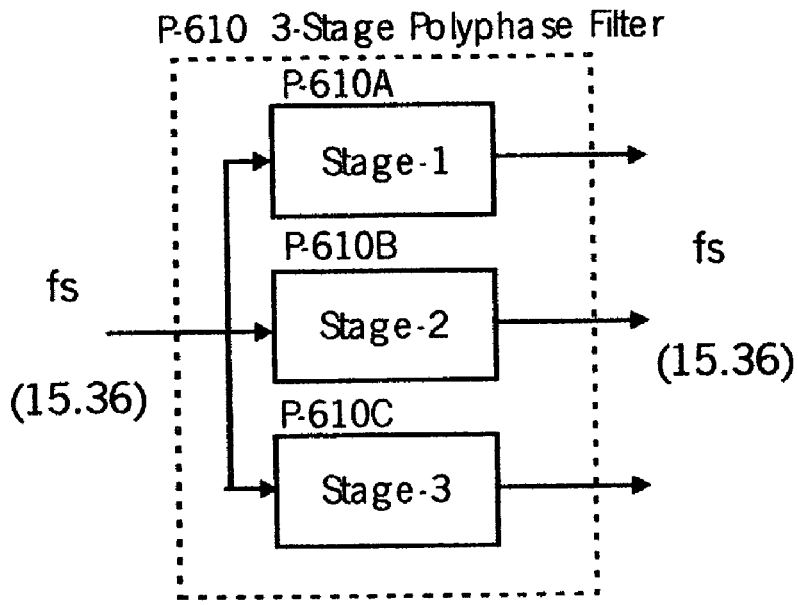
FIG. 12 shows Three Stage Polyphase Filter.

The six-channel channelizer is composed of a pair of 3-channel channelizers, The upper 3-channel channelizer extracts the three wideband UTRA channels centered at −5 MHz, 0 MHz, and +5 MHz. The lower 3-channel channelizer extracts the overlapped bands centered at −2.5 MHz and a +2.5 MHz. This lower segment of the processing block is disabled when the signal set is composed of the three-wideband UTRA carriers. As stated, the initial processing block of the resampling 6-channel Channelizer is a pair of three-stage linear-phase recursive polyphase filters (P-610) that is shown in FIG. 12. The output of the polyphase filter is processed by a 3-point DFT (P-620) that may be implemented directly as a DFT or as a 3-point Winograd transform. The 3-point DFT contains and applies the phase rotators to the output of the polyphase filter to perform a phase coherent extraction of the desired Nyquist zone from the aliased components now residing at zero frequency due to the down sampling operation. Heterodynes (P-630) are applied to four of the channelized time series to remove a residual frequency offset of the spectra aliased from the Nyquist zones centered at +5.12 MHz, 2.56 MHz, −2.56 MHz and −5.12 MHz. The residual offsets of 0.12 and of 0.06 MHz are the 0.12 MHz and 0.06 MHz offsets from the aliased center frequency relative to the channel center frequencies of ±5.00 MHz and ±2.56 MHz respectively.

Figure 13:
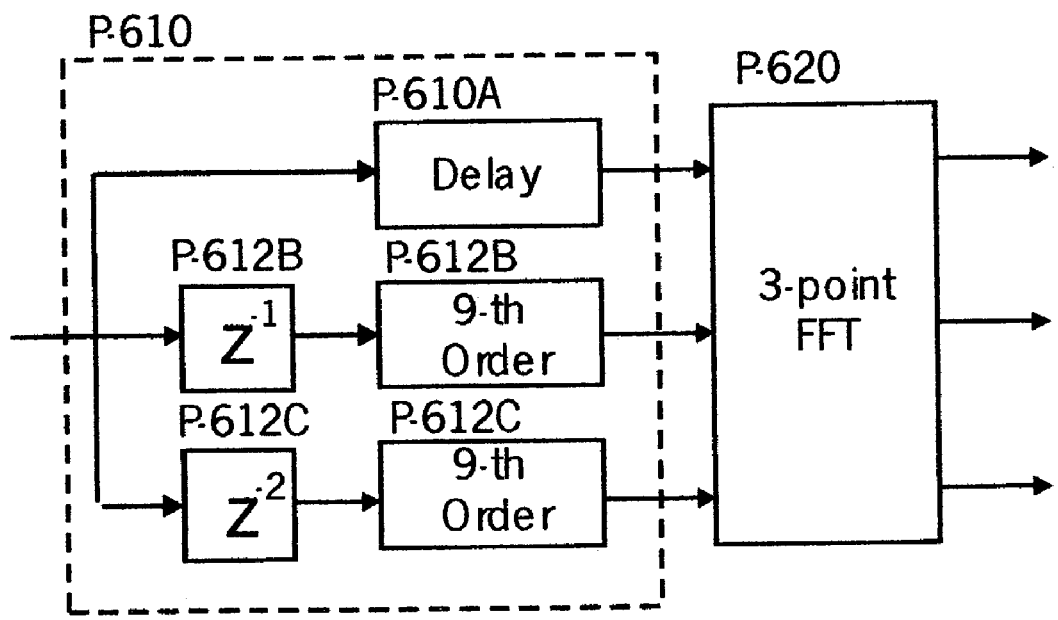
FIG. 13 depicts Details of Three-Stage, Linear Phase Recursive Polyphase Channelizer.
Figure 14:
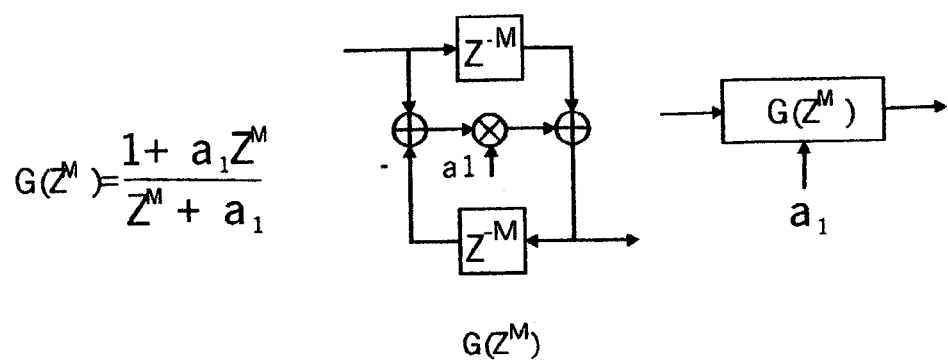
FIG. 14 shows First Order Recursive All-Pass Filter in $Z^M$
Figure 15:
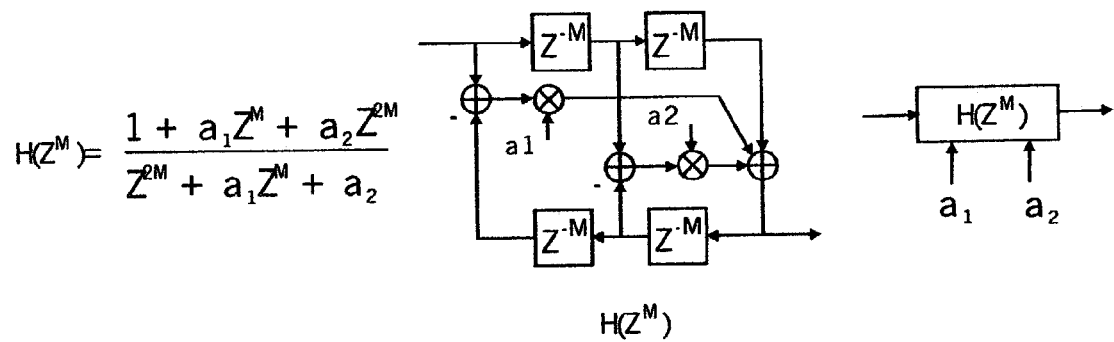
FIG. 15 shows Second Order Recursive All-Pass Filter in $Z^M$.

The three-stage polyphase filter (P-610), shown in FIG. 12 and in more detail in FIG. 13, is formed as a multi-path filter containing three stages (P-610A, P-610, and P-610C). For the more general, M-stage case, there would be M-stages in the partition. Each stage of the polyphase structure is formed as an N-th order linear-phase all-pass recursive filter in the polynomial $Z^M$. For this embodiment; the N-th order network is implemented by cascade first order and second order polynomials in $Z^M$. For this configuration, the all-pass networks are first and second order polynomials in $Z^3$. An N-tap delay line forms the upper stage of the partition, which by default is a linear phase filter segment. This stage requires no arithmetic processing and is present to establish the linear phase response of the composite filter. For this configuration, the delay line has 27 delays and is represented in operator notation as $Z^{-27}$. A cascade of first and second order all-pass networks shown in FIGS. 14 and 15 form the remaining stages of the M-path network.

Figure 16:
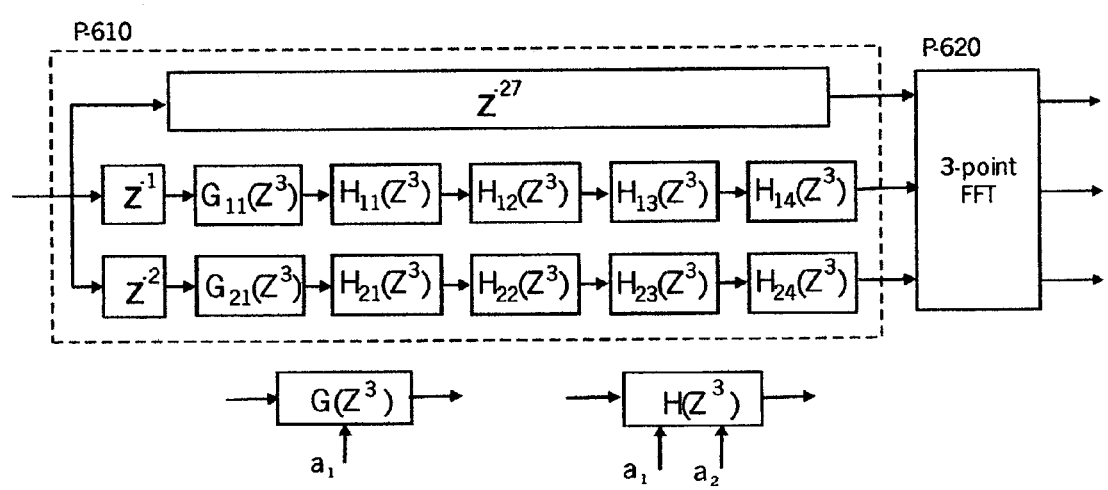
FIG. 16 depicts Detailed Block Diagram of Three Stage, Linear Phase, Recursive Polyphase Filter.

FIG. 16 presents the detailed structure of the recursive polyphase filter. Stages 2 and three of the polyphase partition contain a cascade of first order filters $G(Z^3)$ and second order filters $H(G^3)$. Each stage also contains an isolated delay element, which can be embedded in one of the cascade segments within the stage. These cascade segment filters are implemented with one or with two multiplications, respectively, per input point, Thus the 9-th order filter in each of stage 2 and 3 require only 9 complex products. The workload for the entire filter is 18 complex products per input point.

Figure 17:
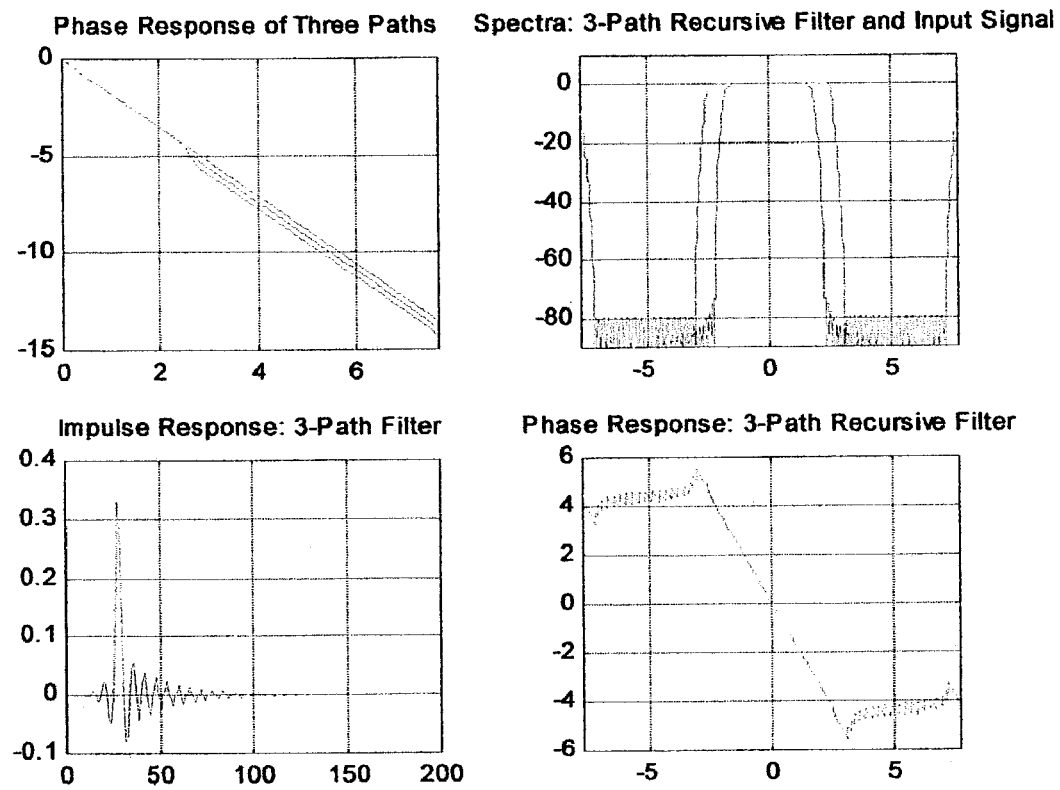
FIG. 17 depicts Phase Response of Three stages of polyphase filter, Magnitude Response, Impulse response, and Phase Response of Composite, three stage Polyphase Filter.
Figure 18:
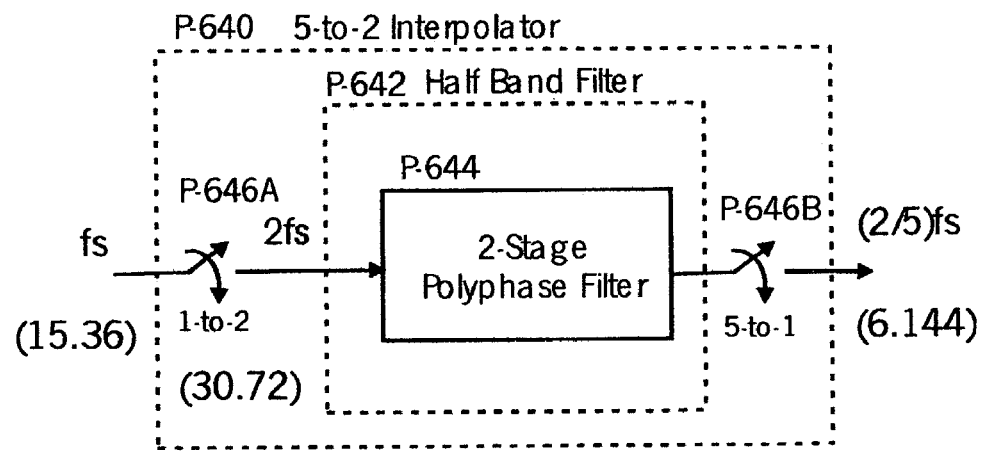
FIG. 18 shows Five-to-Two Interpolator.

FIG. 17 presents some of the characteristics of the three-path linear phase recursive all-pass filter. In the upper left sub-figure, we see the phase response of the three paths. We see that in the pass band of the filter, the three paths exhibit linear, identical phase. In fact the two paths have phase responses that are equal-ripple approximations to the linear phase of the delay line path. In the out-of-band spectral region, the three paths differ by 120 degrees, so that when added the signal components in this band destructively cancel and form the stop band. The phase rotators following the polyphase add multiples of 120-degree phase to the three paths. The combination of phase difference in the stages, and the phase correction by the rotators, enables the destructive cancellation in different frequency intervals. Thus the single filter can exhibit multiple pass bands defined the phase rotators. The sub figure in the upper right presents the frequency response exhibited by the summation without the benefit of phase rotators. This of course is the base-band frequency response. Also shown as an overlay, is the bandwidth of a nominal wide-band signal for which the filter has been designed to extract. The sub figure in the lower left is the impulse response of the composite filter. We can note the precursor tails of the impulse response that tell us this is a non-minimum phase filter, a necessary but not sufficient requirement to obtain linear phase. Finally, the sub-filter in the lower right presents the phase response of the composite filter. Note the linear phase in the pass band of the filter and of the pass band signal.

The three output samples from the output port of the 3-stage polyphase filter are presented to a 3-point DFT (P-620). This is a standard numerical algorithm that can be implemented directly as a collection of Inner Products, as a factored FFT, or as a reduced multiplication Winograd Transform.

The five retained output samples from the pair of 3-point DFT are time samples representing translated, filtered, and re-sampled signals from each of the center frequency bands described earlier. These include the three-wideband signals comprising the 3-G signal set as well as the overlapped bands centered at ±2.5 MHz that are only used in the last two frequency assignments shown in FIG. 1.

Figure 19:
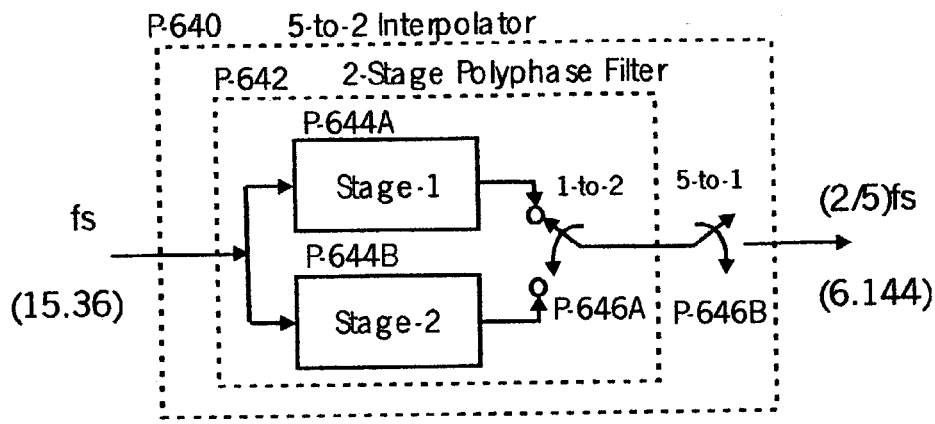
FIG. 19 depicts Five-to-Two Interpolator With Input Resampler Moved to Output Port.

The polyphase channelizer described just described has been operated with an output rate equal to its input rate of fs (15.36 MHz) The next processing step in the receiver chain is the resampling of the signals to obtain an output sample rate of ⅖ fs, (6.144 MHz). This step is accomplished by the 1-to-2 interpolating filters (P-640) followed by a 5-to-1 down sampler. This structure is shown in FIG. 19. The half-band filter selected for the interpolator of this invention is a two-path linear phase recursive filter built as a set of first and second order all-pass networks in $Z^2$.

Since the half-band filter is designed as a polynomial in $Z^2$, and knowing that two units of delay at the output rate is the same as one unit of delay at the input rate, we can interchange the order of 1-to-2 up-sampling and filtering. This is shown in FIG. 20.

Figure 20:
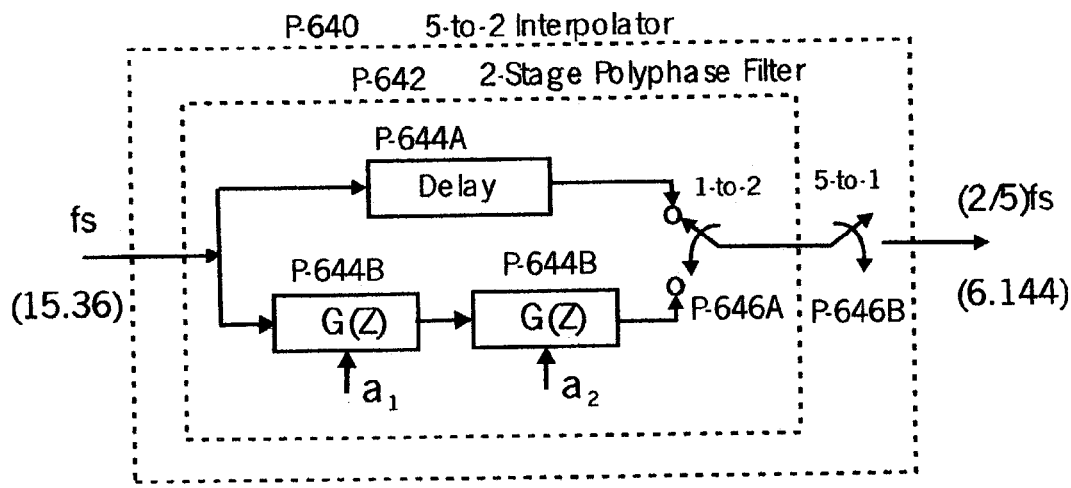
FIG. 20 depicts Five-to-Two Interpolator with Re-sampled Linear-Phase Recursive Filter.
Figure 21:
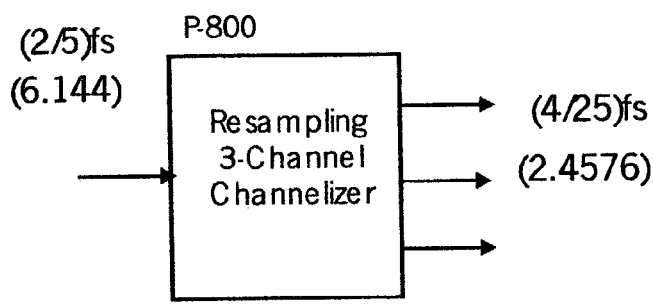
FIG. 21 shows Input-Output Sample Rates of Narrow Band Channelizer.

When the two-path half-band, linear phase, and now re-sampled structure is inserted in FIG. 20, we obtain FIG. 21. This is a particularly efficient resampling half-band filter. We note that without the 5-to-1 down sampler, the half band filter outputs two output samples per input. We also note that the workload for the top path is zero, and that for the bottom path is two multiplications for a workload of one multiply per output point.

The interaction of the two commutators can be described in a simple scheduling routine that is listed in table 1. From this table we see that the five input samples are partitioned into two subsets, one of three successive samples, and one of two successive samples. For each input sample we must exercise the recursive filter stage, and after three input samples we take an output sample from the lower path, and after the next two input samples, we take an output sample from the upper path. Note that 5 inputs requires 10 products for a workload of two products per input point, and when we extract our two outputs at the cost of ten products, we determine the output workload at five products per output sample.

TABLE 1

Schedule Between Input Samples and Output
Samples of 5-to-2 Interpolator

State 1: Input Samples: 3: (n, n + 1, & n + 2)   Output: Top (delay)
State 2: Input Samples: 2: (n + 3, n + 4 )       Output Bottom (filter)

Note that a single stage recursive prototype filter constrained by architecture to have linear phase has been used to filter and translate all three wideband channels as well as, via the second channelizer, the overlapped narrowband signals bands in preparation for further processing. The filter is a three-path filter requiring 9 products for each of two paths, and zero operations for the top path. Let us compare the savings attributable to the polyphase filter partition. In the direct implementation, a 90-tap prototype low pass FIR filter will meet the transition bandwidth and out-of-band attenuation requirements for the broadband channel decomposition. Similarly, a 10-tap prototype low pass FIR filter will meet the transition bandwidth and out-of-band attenuation requirements of the up-2, down-5 interpolator. Using these lengths as a benchmark, we can compare the relative workloads, in equivalent complex operations, of the two options, direct processing and the technique described here. A complex operation (comp-op) is considered to be a complex scalar multiply and add, requiring two real multiplies and adds. In the direct implementation, the workload to process 5 input samples is 20 comp-ops for the input heterodynes, 1350 comp-ops for the three filters, and 60 comp-ops for the interpolators. The workload for all three channels is 1430 comp-ops per 5-inputs or equivalently 1430 comp-ops per 2-outputs. Normalizing by the number of channels and number of data points we obtain a workload of approximately 95 comp-ops per input data point per channel or 238 comp-ops per output data point per channel. In the polyphase resampling implementation the workload to process 5 input samples is 90 comp-ops for the filter, 20 comp-ops for the DFT, 20 comp-ops for the output heterodynes, and 30 comp-ops for the interpolators for a total of 160 comp-ops per 5-inputs or 160 comp-ops per 2-outputs. Normalizing by number of channels and number of data points we obtain a workload of approximately 11 comp-ops per input data point per channel or 27 comp-ops per output data point per channel. The relative workload for the direct versus the polyphase resampler is approximately 9-to-1.

Second Processing Block

Figure 22:
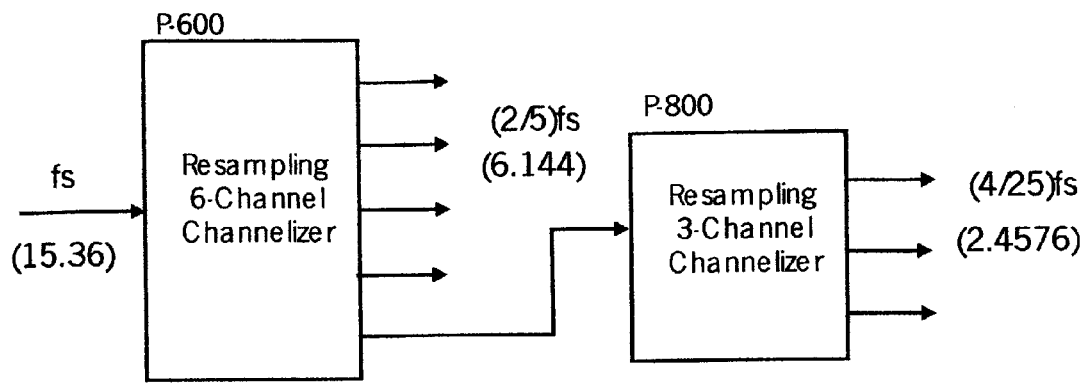
FIG. 22 shows Cascade of resampling 6-Channel and Resampling 5-Channel Channelizers.

We now consider the second processing block of this invention, the resampling 5-channel channelizer that is shown in FIG. 22. This processing block performs the second level partition of the wideband bandwidth into three narrowband bands occupying the same nominal bandwidth of the single broadband channel. This process also extracts the narrowband signal from the two overlapped bands when required. This set of signals is composed of three or four CDMA-2000 channels separated by 1.25 MHz offsets and centered at +5.0 MHz as shown in the mixed signal set presented in the second option in FIG. 1.

Figure 23:
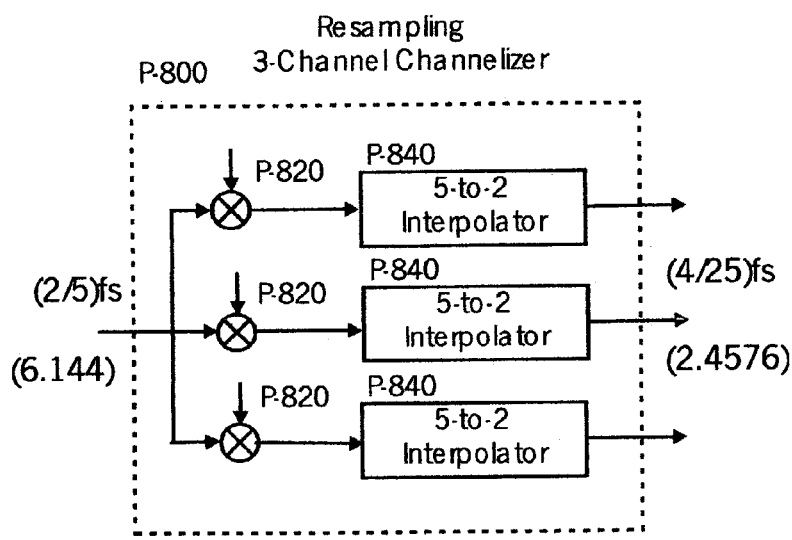
FIG. 23 depicts Fundamental Processing Blocks of Narrowband three-Channel Channelizer.

The 3-channel resampling channelizer uses the 6-channel resampling channelizer as a preprocessor and initial bandwidth and sample rate reducer. This arrangement is shown in FIG. 23.

The resampling 5-channel channelizer can be based on a non-recursive filter structure or on a recursive filter structure. A related patent (Resampling Digital FIR Filter Structure for Demodulating 3G Wireless Signals) addresses the non-recursive option. In this embodiment, we address the recursive option.

Figure 24:
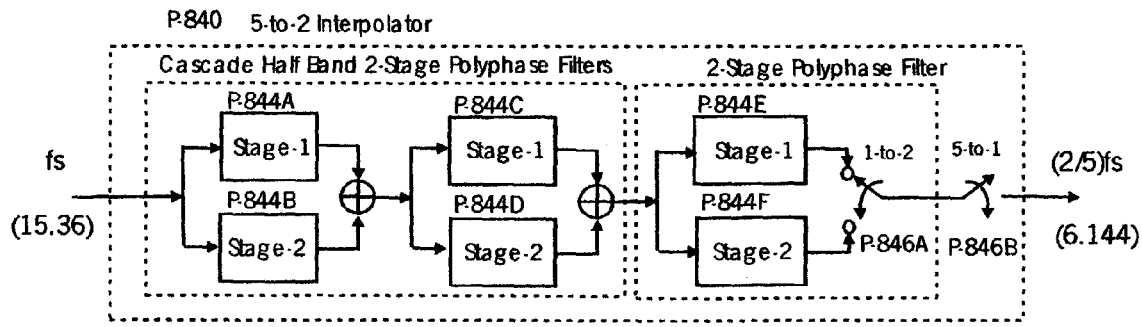
FIG. 24 shows Block Diagram of Recursive, Linear-Phase, Two-Path Bandwidth Reducing and Sample Rate Modifying Network.

Three fundamental processing blocks of the resampling 5-channel channelizer are shown in FIG. 24. The separation of center frequencies (1.25 MHz) of the CDMA-2000 does not coincide with a rational multiple of the sample rate such as multiples of 1.2288 MHz. Consequently, the tight coupling between bandwidth and center frequency of the linear-phase recursive polyphase all-pass networks prevents us from using the single polyphase filter to service the multiple equally spaced carriers as can be done in a FIR filter embodiment. The implementation shown in figure employs traditional heterodynes and efficient linear-phase polyphase recursive filters for the interpolation process.

Figure 25:
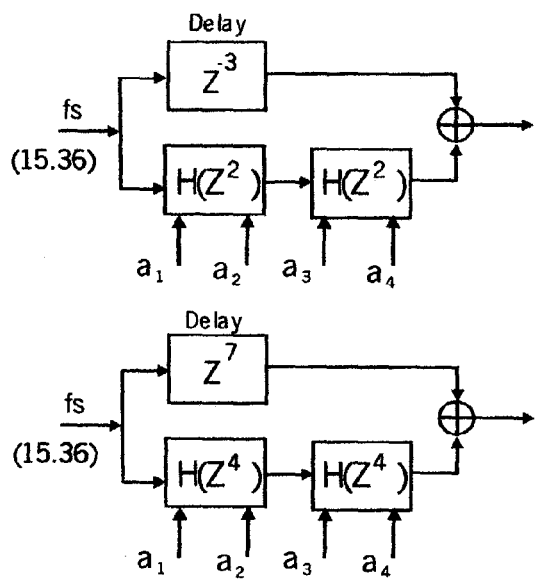
FIG. 25 shows Expanded Description of Half-band Polyphase Filter Set.
Figure 26:
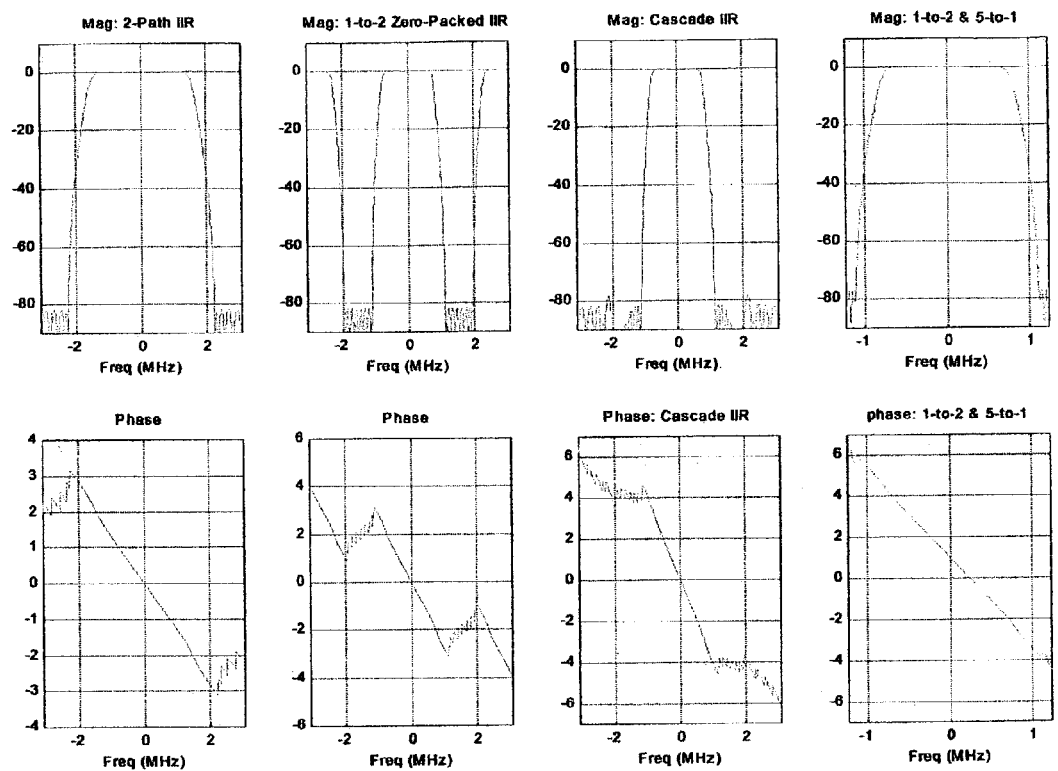
FIG. 26 shows Log-Magnitude Response and Normalized Phase Response of Filter Stages in 2-to-5 Resampling Interpolator.

The initial processing block of the narrowband 3-channel Channelizer is the complex heterodyne (P-820) that moves each of the three (or one) narrowband CDMA-2000 signals to base band. The base band signal is then presented to the 5-to-2 interpolator (P-840) that reduces the bandwidth to match the desired output sample rate and then performs the interpolation to that rate by a combination of up-sampling and down-sampling. The interpolator, presented with moderate detail in FIG. 25, is implemented by a cascade of three linear-phase, recursive polyphase filters and a commutator that mimics the interaction of the up sampler and down sampler commutators. Two of the polyphase filters reduce the signal bandwidth without sample rate change while the third polyphase filter performs the desired 1-to-2 up sampling. The resampling filter is the same structure presented in FIG. 21. The dual half band filters are shown in more detail in FIG. 26. The filters are formed as dual path structures, with the upper path restricted to be pure delay to obtain a linear phase system. The lower path is formed by the recursive all-pass structures presented earlier. These all pass structures have one or two multiplies per stage, where a single multiply forms both the numerator and the denominator. The two filters in the cascade differ by the order of their respective polynomials. The first filter is a ratio of polynomials in $Z^2$ while the second is a ratio of polynomials in $Z^4$. This structure is called an iterated filter in which one stage replicates its spectrum by zero-packing its impulse response and the other filter rejects the spectral replicate. The frequency and phase response of the separate and of the cascade filter stages in the 2-to-5 interpolator are shown in FIG. 27.

The spectrum in the first figure, counting left-to-right, is the prototype, 4-multiply half band filter formed as polynomials in $Z^2$. The spectrum shown in the second figure is the zero packed, hence replicated spectra, obtained by operating a copy of the first filter but operating with 4-delays ($Z^4$) per stage rather than 2-delays ($Z^2$). This filter is also a 4-multiply (zero-packed) half band filter. The spectrum shown in the third figure is that obtained by cascading the two previous filters. The pass band of the composite corresponds to the intersection of their separate pass bands, hence is defined by the zero-packed filter. This composite filter exhibits linear phase over its bandwidth and has a transition bandwidth and out-of-band attenuation level that, if implemented as a FIR filter, would require 108 taps. The filter as shown requires 8-multiplies per input data sample. The 4-th and last figure presents the log-magnitude and phase response of the total composite filter, including the 1-to-2 up sampling and the 5-to-1 down sampling operation. The entire composite filter has a workload, exclusive of the down sampling, of 10-operations per input sample or 5-operations per output sample. Since the down sampler discards 4-out-of-5 samples, the workload per retained sample is 25 operations per output sample. Other combinations of down sampling, polyphase half-band filtering, and up sampling can be assembled to effect the same bandwidth reduction and sample rate change. Advantages of this class of two-path, linear-phase, recursive, half-band polyphase filters over traditional FIR and IIR filters are:

1. A single multiply in an all-pass filter, formed as polynomials in $Z^2$, forms two poles and two zeros: four roots per multiply.
2. One path in the two path filter contributes only delay, hence makes no contribution to the computational workload.
3. The delay-only path assures that the composite filter response exhibits equal-ripple group delay.
4. The two path filter, formed by parallel all-pass networks exhibits a trivial gain of 2, which is easily scaled away at the filter output.

FIG. 20. Scheduling of Input data Commutator and Internal Weight Set Commutator Note that a cascade stage comprising various interconnections of a prototype filter has been used to filter and resample all three or four narrowband channels from an initial input rate of 5 samples per symbol down to a lower sample rate of 2 samples per symbol. A 108-tap prototype low pass FIR filter will meet the transition bandwidth and out-of-band attenuation requirements. Using this length as a benchmark, we can compare the relative workloads, in equivalent complex operations, of the two options, direct processing and the technique described here. In the direct implementation, the workload to process each input sample is 2 comp-ops for the input heterodyne and 108 comp-ops for the filter for a total of 110 comp-ops per input per channel. In the polyphase resampling implementation using the cascade versions of the two-path recursive filter, the workload to process each input sample is 2 comp-ops for input heterodyne and 10 comp-ops for the filter for a total of 12 comp-ops per input sample. The workload ratio for direct versus the down sampling technique is approximately 10-to-1.

The embodiment of the invention currently preferred by the inventor has been described, but one skilled in the art of digital signal processing and digital receiver design will be enabled by acquaintance with the foregoing disclosure to design a number of alternative embodiments of this invention, and this should be borne in mind when construing the scope of the claims which follows this specification.

I claim:

1. A receiver for receiving and efficiently separating a composite 3-G wireless communications signal into constituent baseband components, wherein said receiver combines multiple processing tasks of a 3-G receiver into a single filter, the single filter comprising, an equal ripple linear phase recursive filter channelizer performing simultaneous spectral translation and bandwidth reduction of multiple channels, an equal-ripple linear phase recursive filter interpolator for performing sample rate changes, whereby the equal ripple linear phase recursive filter channelizer performs the processing tasks required to operate multiple channels, including spectral translation, bandwith reduction, sample rate changes, and outputs a separate time series for each channel in the composite 3-G wireless communications signal.

* * * * *